United States Patent
Schneider et al.

(10) Patent No.: US 6,956,404 B2
(45) Date of Patent: Oct. 18, 2005

(54) DRIVER CIRCUIT HAVING A PLURALITY OF DRIVERS FOR DRIVING SIGNALS IN PARALLEL

(75) Inventors: Ralf Schneider, München (DE); Marcin Gnat, München (DE); Joerg Vollrath, Olching (DE)

(73) Assignee: Infineon Technologies, AG (DE)

( * ) Notice: Subject to any disclaimer, the term of this patent is extended or adjusted under 35 U.S.C. 154(b) by 1 day.

(21) Appl. No.: 10/819,222

(22) Filed: Apr. 7, 2004

(65) Prior Publication Data

US 2004/0222820 A1 Nov. 11, 2004

(30) Foreign Application Priority Data

Apr. 10, 2003 (DE) .......................................... 10316579

(51) Int. Cl.$^7$ .......................................... H03K 19/094
(52) U.S. Cl. .............................. 326/86; 326/90; 326/82
(58) Field of Search .............................. 326/82, 83, 86, 326/89, 90

(56) References Cited

U.S. PATENT DOCUMENTS 6,507,219 B2 * 1/2003 Dabral et al. ................. 326/86

FOREIGN PATENT DOCUMENTS

| JP | 09027742 A | 1/1997 |
| JP | 09321602 A | 12/1997 |

* cited by examiner

*Primary Examiner*—Anh Q. Tran
(74) *Attorney, Agent, or Firm*—Edell, Shapiro & Finnan, LLC

(57) ABSTRACT

In a driver circuit having a plurality of drivers for driving signals in parallel, the drivers are each connected to an input signal line for receiving a respective input signal and to an output signal line for outputting a respective driven output signal. An output signal line of one of the drivers may be connected, via a switch or switching means, to an output signal line of another of the drivers. A control circuit is connected to one of the drivers and is used to drive the switch or switching means in such a manner that the switching means can be activated, for charge equalization, by the control circuit following a driving operation in one of the drivers. A respective associated memory circuit, by which an associated logic circuit for driving one of the switch or switching means is connected to the relevant output signal line, is connected to the respective output signal line. Overall power consumption of the driver circuit can be minimized.

12 Claims, 1 Drawing Sheet

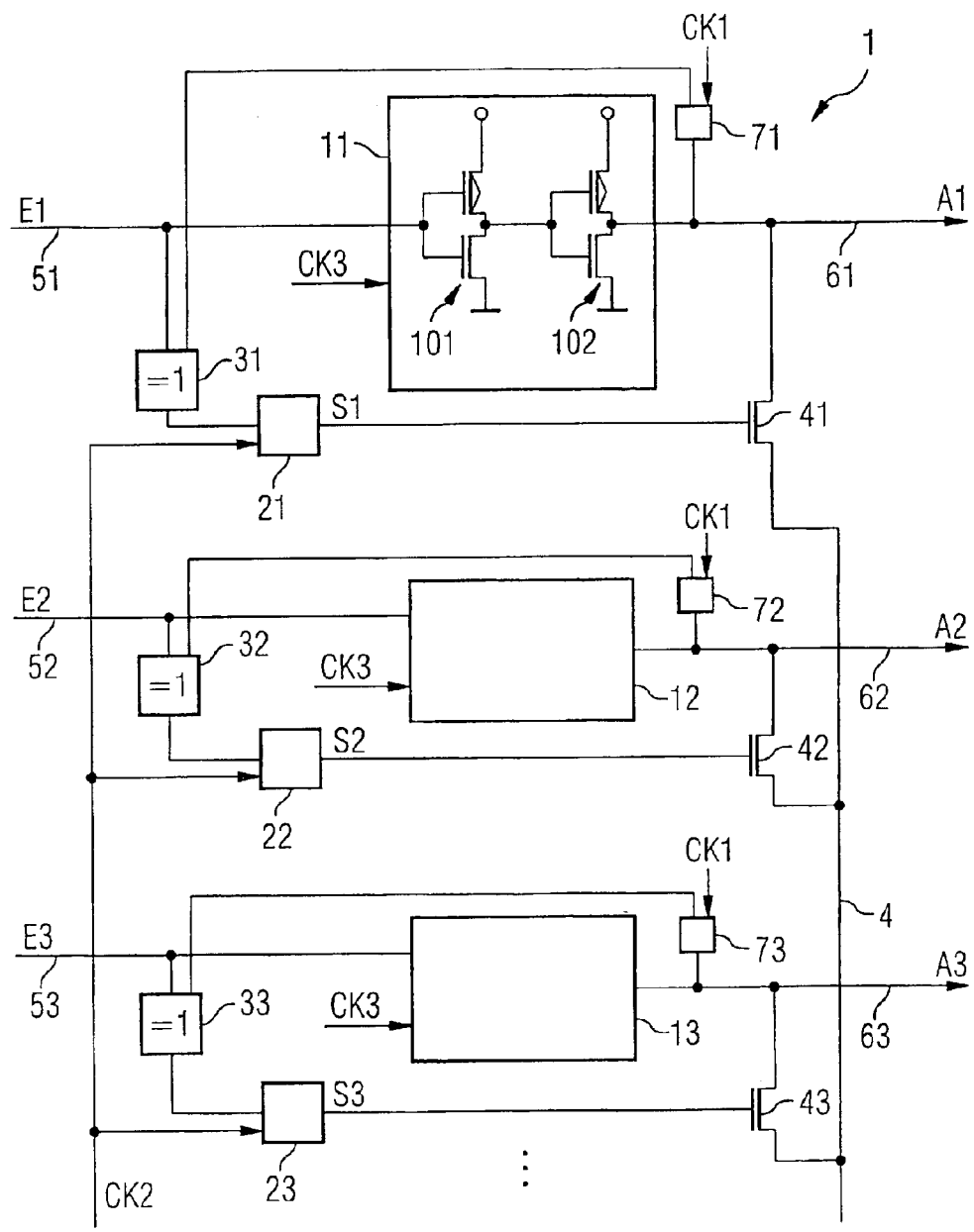

DRIVER CIRCUIT HAVING A PLURALITY OF DRIVERS FOR DRIVING SIGNALS IN PARALLEL

CROSS-REFERENCE TO RELATED APPLICATIONS

This application claims priority under 35 USC §119 to German Application No. 10316579.7, filed on Apr. 10, 2003, and titled "Driver Circuit Having A Plurality Of Drivers For Driving Signals In Parallel," the entire contents of which are hereby incorporated by reference.

FIELD OF THE INVENTION

The present invention relates to a driver circuit having a plurality of drivers for driving signals in parallel, in which the drivers are each connected to an input signal line for receiving a respective input signal and to an output signal line for outputting a respective driven output signal.

BACKGROUND

Driver circuits having a plurality of drivers for driving signals in many integrated circuits. For example, integrated circuits, such as, in particular, integrated memory circuits, are used in different data configurations or organization forms. The organization forms differ, in particular, in the number of data lines used. The data lines are connected to data connection pads, i.e., I/O pads. In this case, the number of I/O pads depends on a predetermined system bus width. The I/O pads are used to interchange data signals, in particular, between the integrated circuit and a system controller, for example.

A driver circuit having a plurality of drivers for driving data signals in parallel is required for the purpose of driving the data signals. The drivers in such a driver circuit are connected to a respective input signal line for receiving a respective input signal to be driven and to a respective output signal line for outputting a respective driven output signal. Against the background of using integrated circuits in mobile data processing systems, in particular, it is desirable to reduce the power consumption of an integrated circuit.

SUMMARY

A driver circuit in an integrated circuit can reduce the power consumption of the integrated circuit. Such a driver circuit can have a plurality of drivers for driving signals in parallel. The drivers can be connected to a respective input signal line for receiving a respective input signal and to a respective output signal line for outputting a respective driven output signal. According to the invention, an output signal line of one of the drivers may be connected, via a switch or switching means, to an output signal line of another of the drivers. A control circuit can be connected to one of the drivers, and can drive the switch or switching means, which can be activated by the control circuit following a driving operation in one of the drivers.

The overall power consumption of the driver circuit can be minimized, since, statistically assuming that at least some of the drivers in the driver circuit will drive different signal states, charges between the output signal lines of these individual drivers via the respective switch or switching means, in particular, if the state of an output signal (which has been driven by the driving operation) from a relevant driver differs from that of an output signal, which is to be subsequently driven, from the driver can be equalized. The charges for this switching operation, therefore, would not need to be externally provided by a voltage supply for the integrated circuit.

The driver circuit can have a common line, in which case the output signal lines of the individual drivers can be connected to the common line via a respective switch or switching means. Following a respective driving operation, a multiplicity of drivers (to be operated in parallel) to one another within the driver circuit via a respective switch or switching means can be connected in order to achieve charge equalization on the relevant output signal lines. As the number of drivers increases, the statistical probability increases that at least some of the drivers will drive a different signal state to the respective other drivers when driving output signals in parallel. This can increase the potential for effective power reduction in the driver circuit.

In accordance with the invention, the individual drivers each can have an associated logic circuit. The inputs of the drivers can be connected to the respective output signal line and to the respective input signal line of the associated driver. A logic circuit such as this, in particular, exclusive ORs (EXORs) the signals applied to the inputs. Each logic circuit can produce a control signal which is fed to the associated switch or switching means via a pulse shaper, for example. The above-described embodiment of the logic circuit can be used, for example, in non-inverting drivers in the driver circuit in order to compare the state of a previously driven output signal with the state of a subsequently received input signal, with the received input signal not changing its logic state during the subsequent driving operation on account of the non-inverting driver circuit.

Connected to the respective output signal line is a respective associated memory circuit by which the respective associated logic circuit is connected to the relevant output signal line. The previously driven output signal can be prevented from changing its state (as a result of the subsequently received input signal) before being fed to the respective logic circuit. Each memory circuit can be respectively overwritten by a subsequent driven output signal.

BRIEF DESCRIPTION OF THE FIGURES

The invention is explained in more detail below with reference to the figure which is illustrated in the drawing and represents an embodiment of an inventive driver circuit.

FIG. 1 shows an embodiment of a driver circuit having a plurality of drivers for driving signals in parallel.

DETAILED DESCRIPTION

Referring to FIG. 1, as is shown, by the driver 11, for example, the drivers 11 to 13 can be non-inverting drivers and can have, for example, two series-connected inverter stages 101 and 102. The drivers 11 to 13 can be, respectively, connected to one of the input signal lines 51 to 53 for receiving a respective input signal E1 to E3 and to one of the output signal lines 61 to 63 for outputting a respective driven output signal A1 to A3.

In accordance with the invention, the driver circuit 1 can have a common line 4. The output signal lines 61 to 63 of the individual drivers 11 to 13 can be connected to the common line 4 via a respective switch 41 to 43. At least one of the output signal lines 61 to 63 of one of the drivers 11 to 13 can be connected in this manner to at least one output signal line of another of the drivers. In this case, the switches 41 to 43 can be driven by a control circuit which, in the present exemplary embodiment, in each case can have a logic circuit and a pulse shaper.

Each driver 11 to 13 in the driver circuit 1 can have a respective associated logic circuit 31 to 33, which can produce, via a respective pulse shaper 21 to 23, a respective control signal S1 to S3, which can be fed to the respective associated switch 41 to 43. A first input of the respective logic circuit 31 to 33 can be connected to the output signal line 61 to 63 of the associated driver, and a second input of the respective logic circuit 31 to 33 can be connected to the input signal line 51 to 53 of the associated driver.

In the present exemplary embodiment, the logic circuits 31 to 33 can be EXOR gates. A respective input signal E1 to E3 can be exclusive ORed with the respective output signal A1 to A3. As explained with reference to the driver 11, for example, EXORing the driven output signal A1 with the subsequently received input signal E1 can produce a logic state 1 at the output of the logic circuit 31, when the state of the driven output signal A1 differs from that of the subsequently received input signal E1. This active output signal from the logic circuit 31 can be fed to the pulse shaper 21, which can use it to produce a pulsed control signal S1 for driving the switch 41, with the result that the latter changes to the on state. In the event of the state of a driven output signal differing from that of a subsequently received input signal in another of the drivers, for example, driver 13, the relevant associated switch 43, in the example, can be switched on by the associated control circuit in an analogous manner to that described above, with the result that the output signal line 61 can be connected to the output signal line 63 of the other driver 13 via the relevant switches 41 and 43 which have been switched on.

In the additional event of the switching operations in the relevant drivers being complementary to one another, the conductive connection between the relevant output signal lines via the common line 4 can make it possible for charges to be exchanged, with the result that the charge required for a changeover operation does not have to be entirely provided by an external voltage supply. The charge on an output signal line can be reversed in this case, when the state of an output signal, which has been driven using the driving operation differs from that of an output signal which is to be subsequently driven. In this case, the respective output signal lines 61 to 63 can be connected to the common line 4 via the respective associated switch 41 to 43 in order, overall, to reduce the power consumption of the driver circuit by charge equalization within the driver circuit 1. This is based on the statistical assumption that, in the case of a driver circuit having, for example, 16 individual drivers, at least a considerable number of drivers can carry out a complementary switching operation, with the result that mutual charge equalization can be effected via the common line. Ideally, it is possible, in this case, to save up to half of the power which would otherwise have to be used for a switching operation in the driver circuit.

In accordance with the embodiment of the driver circuit shown in the figure, each associated memory circuit 71 to 73, of which the respective associated logic circuit 31 to 33 can be connected to the relevant output signal line 61 to 63, can be connected to the respective output signal line 61 to 63. The previously driven output signal can be prevented from changing its state (as a result of the subsequently received input signal) before being fed to the respective logic circuit. Each memory circuit 71 to 73 can be overwritten by a subsequently driven output signal.

In order to synchronize the above-described operating cycles of the driver circuit 1 and the individual circuit components, the drivers 11 to 13, the pulse shapers 21 to 23 and the memory circuits 71 to 73 can be operated synchronously using clock signals CK1 to CK3 which can be synchronized with one another. For example, the risk of the switches 41 to 43 changing to the on state before the output signals A1 to A3 have een applied to the respective output signal line 61 to 63 for a defined period of time can be precluded. Also, the drivers 11 to 13 can be switched at relatively the same time.

The present invention has been described above with reference to three drivers 11 to 13, but it is in principle possible to apply the invention to a driver circuit having any given number (which is in principle arbitrary) of drivers for driving signals in parallel. Since, in particular, output driver circuits in an integrated circuit, for example, an integrated memory, have a comparatively high power consumption, the present invention may be used with particular advantage for an output driver circuit in which the drivers are in the form of output drivers for driving signals out of the integrated circuit.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Driver circuit
4 Common line
11 to 13 Driver
21 to 23 Pulse shaper
31 to 33 Logic circuit
41 to 43 Switch
51 to 53 Input signal line
61 to 63 Output signal line
71 to 73 Memory circuit
E1 to E3 Input signal
A1 to A3 Output signal
CK1 to CK3 Clock signal
s1 to s3 Control signal
101, 102 Driver stage

We claim:

1. A driver circuit, comprising:

a plurality of drivers for driving signals in parallel the drivers each being connected to an input signal line for receiving a respective input signal and to an output signal line for outputting a respective driven output signal, in which the output signal line of one of the drivers being connected via a switching means to the output signal line of another of the drivers;

a control circuit, the control circuit being connected to one of the drivers, the control circuit driving the switching means, the switching means being activated by the control circuit following a driving operation in one of the drivers, wherein the individual drivers have a respective associated logic circuit, a first input of the respective logic circuit being connected to the respective output signal line, a second input of the logic circuit being connected to the respective input signal line of the associated driver, the respective logic circuit producing a control signal, the control signal being fed to the switching means; and a memory circuit connected to the respective output signal line, the memory circuit connecting the respective associated logic circuit to the output signal line.

2. The driver circuit as claimed in claim 1, wherein the switching means can be activated by the control circuit following a driving operation in one of the drivers, when the state of an output signal which has been driven using the driving operation differs from that of an output signal from one of the drivers.

3. The driver circuit as claimed in claim 1, wherein the driver circuit has a common line, the output signal lines of the individual drivers being connected to the common line via a respective switching means.

4. The driver circuit as claimed in claim 1, wherein each logic circuit EXORs signals applied to the first and second inputs.

5. The driver circuit as claimed in claim 1, wherein the drivers and the control circuit are operated synchronously using a respective clock signal.

6. The driver circuit as claimed in claim 1, wherein the drivers are output drivers for driving signals out of an integrated circuit.

7. A driver circuit, comprising:

a plurality of drivers for driving signals in parallel the drivers each being connected to an input signal line for receiving a respective input signal and to an output signal line for outputting a respective driven output signal, in which the output signal line of one of the drivers being connected via a switch to the output signal line of another of the drivers;

a control circuit, the control circuit being connected to one of the drivers, the control circuit driving the switch, the switch being activated by the control circuit following a driving operation in one of the drivers, wherein the individual drivers have a respective associated logic circuit, a first input of the respective logic circuit being connected to the respective output signal line, a second input of the logic circuit being connected to the respective input signal line of the associated driver, the respective logic circuit producing a control signal, the control signal being fed to the switch means; and a memory circuit connected to the respective output signal line, the memory circuit connecting the respective associated logic circuit to the output signal line.

8. The driver circuit as claimed in claim 7, wherein the switching is activated by the control circuit following a driving operation in one of the drivers, when the state of an output signal which has been driven using the driving operation differs from that of an output signal from one of the drivers.

9. The driver circuit as claimed in claim 7, wherein the driver circuit has a common line, the output signal lines of the individual drivers being connected to the common line via a respective switch.

10. The driver circuit as claimed in claim 7, wherein each logic circuit EXORs signals applied to the first and second inputs.

11. The driver circuit as claimed in claim 7, wherein the drivers and the control circuit are operated synchronously using a respective clock signal.

12. The driver circuit as claimed in claim 7, wherein the drivers are output drivers for driving signals out of an integrated circuit.

* * * * *